Feb. 18, 1969 J. E. MEINHARD 3,428,892

ELECTRONIC OLFACTORY DETECTOR HAVING ORGANIC SEMICONDUCTOR BARRIER LAYER STRUCTURE

Filed Sept. 20, 1965

INVENTOR

JAMES E. MEINHARD

BY Harry R. Lubcke

AGENT

United States Patent Office 3,428,892

Patented Feb. 18, 1969

3,428,892

ELECTRONIC OLFACTORY DETECTOR HAVING ORGANIC SEMICONDUCTOR BARRIER LAYER STRUCTURE

James E. Meinhard, 12472 Ranchwood Road, Santa Ana, Calif. 92705

Filed Sept. 20, 1965, Ser. No. 488,711

U.S. Cl. 324—71 6 Claims

Int. Cl. G01n *27/52*

ABSTRACT OF THE DISCLOSURE

An electronic sensor device for the detection and measurement of an ambient gas, scent, chemical, or trace molecular component. The sensor consists of an organic rectifying structure incised or perforated so as to expose organic layers to the ambient substance while the sensor is under electrical bias. An array of differently constituted organic rectifying structures yields a pattern of reverse currents in unique response to each ambient component sensed. Sensor discrimination is extended through selective application of thermal or radiant energy while simultaneously under electrical bias and exposure to an ambient component. Organic semiconductive rectifying structures meet the two requirements of reversible adsorption and variety of composition, neither of which are possible with inorganic semiconductors. The lack of high conductivity and of high frequency response of organic semiconductors does not preclude their use in sensor applications.

Figure 1:
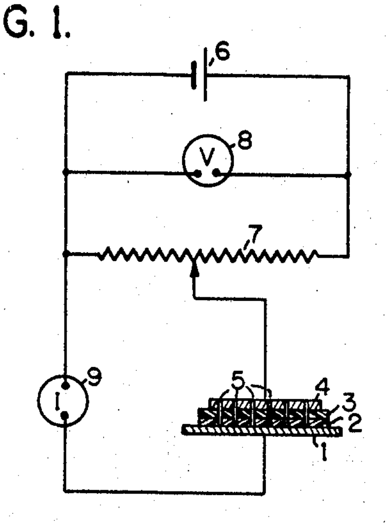

This invention pertains to an electrical sensor comprised of organic materials, which is suited to the detection and measurement of selected molecules of matter.

Semiconductor devices for electrical purposes having junctions between inorganic elements, such as germanium or silicon, are well known. Such devices utilize the peculiar electrical properties associated with junctions of this sort to perform an enormous variety of energy transformations and conversions. These have many useful electronic circuit applications; such as current amplification, radiation detection, rectification, switching, signal detection, logic bit storage, temperature sensing, strain gauging, thermoelectric conversion, and the like.

Equivalent devices employing organic materials are largely unknown. This is due in part to the traditional regard and use of organic materials as insulators, with little recognition or study of possible conductive properties thereof, and in part to the previous lack of understanding of electronic conduction in these materials. Because of this lack of understanding, the interdisciplinary aspects of employing organic materials for electronic purposes have not been appreciated and the extension of inorganic semiconductor art to organic materials has been limited.

It has been found, nevertheless, that certain organic substances have electrical properties analogous to N and P conduction in inorganic semiconductors. It is not generally appreciated that the electron donor and electron acceptor mechanisms relate to molecular entities rather than to atomic entities, as in inorganic semiconductors. This behavior is due to the fact that organic molecules are not valence-bonded into the crystal lattice, as are the atomic entities of an inorganic semiconductor. This permits the organic molecules to act in a largely individual fashion whereas atomic behavior in the inorganic semiconductor is directly coupled to the entire network of atoms comprising the crystal lattice. Consequently, attempts to apply inorganic semiconductor theory, such as the band theory, to organic conductive materials have not been very successful, nor have they led to the development of significantly useful electronic devices. Conversely, recognition that organic conductivity arises from molecular entities, or excited molecular orbital states, which may act as donors or acceptors of electrons according to the molecular structures involved, leads directly to the application of organic substances in certain useful electronic devices.

Organic devices according to this invention exhibit diode rectification at junctions between organic materials having different conductivities. These include P and P+ junctions as well as N and P junctions, and to a lesser extent N and N+ junctions, in the organic materials now known. Certain junctions are also photoelectrically sensitive.

In preparing such devices organic materials may be selected on the basis of functional electrical tests; such as the polarity of photoconductivity, Seebeck effect, or current-voltage characteristic of a junction with another material, organic or inorganic, having known semiconductor behavior. In general, the N-type organic conductors will be in the class of compounds known as reducing agents, or as Lewis bases, and more particularly, soft bases having easily deformable molecular orbital configurations which tend to lose electrons to nearby molecules. Examples are phenazine and certain charge transfer complexes.

In general, the P-type organic conductors will be in the class of compounds known as oxidizing agents, or as Lewis acids, and more particularly, soft acids having easily deformable molecular orbital configurations which tend to accept electrons from nearby molecules. Examples are molecules capable of existing in biradical acceptor form, such as polynuclear aromatic compounds and pyrolyzed polymers; certain charge transfer complexes, such as chloranil+p-phenylenediamine, or iodine+anthracene; aromatic nitro compounds or their complexes; quinones and quinone derivatives; certain dyestuffs; other highly conjugated aromatic or aliphatic compounds or derivatives thereof. Furthermore, the thermal activation energies of conduction, as well as the effective carrier concentrations, will vary widely within each class, thereby making diode rectification realizable in intraclass as well as interclass junctions.

An example of a useful junction between N and P materials is phenazine (N-type) and a mixture of chloranil and p-phenylenediamine (P-type). Examples of P and P+ junctions are indigo and chloranil, indigo and a mixture of chloranil and p-phenylenediamine, chloranil and a mixture of chloranil and p-phenylenediamine, and indigo and fluorescein. An example of an N and N+ junction would be phenazine and a complex of tetracyanoquinodimethane with triethylamine.

Although these junctions may have application as conventional rectifiers, the fact that they are sensitive to certain molecules when they are properly exposed opens a vast new field in electrical sensitometry according to this invention. Olfactory detection becomes possible. With plural differently constituted such detectors, both qualitative and quantitative identification of molecular substances may be had. This device application is unique to organic conductive materials and is not possible with inorganic semiconductors, such as silicon and germanium.

It is, in fact, contrary, and therefore unobvious, to present semi-conductor art because exposed inorganic junctions adsorb foreign molecules irreversibly, causing permanent impairment of the intended function. Organic conductors, however, give up the adsorbed molecules when the corresponding molecules in the ambient gas or liquid are diluted or removed. Furthermore, the electrical response of organic conductors to adsorbed foreign molecules is dependent on a complex interaction between the molecular orbital configuration of each and is unique for each foreign molecule. The kind of response would also be qualitatively possible in a simple resistive element comprised of a single organic conductor. However, in a rectifying junction the rectification ratio provides a multiplication factor not present in a simple resistive element, and the electrical response to an adsorbed molecular species is considerably magnified thereby. In other words, the molecular sensing function of this invention pertains to a change in the rectification ratio, not to a change in simple resistance.

To prepare a junction as a molecular sensor it is necessary to expose the layers of the junction in an edgewise, or sandwich, fashion. For a device of practical sensitivity this may be done by mechanical incision of the sandwich layers, by electrical discharge through the layers, by laser milling of the layers, or by other similar means. Plural incisions are preferably employed to enhance the sensitivity by greater exposure of the sensitive junction. A junction so exposed becomes sensitive to foreign molecules when an electrical potential is applied to the opposite organic layers, particularly in the reverse bias mode. When foreign molecules arrive at the junction an immediate change in rectification properties occurs, which is detected as a change in current flowing through the junction. The greater the concentration of foreign molecules, the greater has been found the response. When the foreign molecules are removed the current flow through the junction reverts to its initial value. The effect, according to present physico-chemical theory, is considered to be due to the physical adsorption of a portion of the foreign molecules on the respective surfaces of the organic substances comprising the junction. The forces involved in the adsorption may include, but are not necessarily limited to, dispersion forces, dipole interactions, induced dipole interactions, and the fringing electrical field resulting from the applied potential on the device. These forces are different for different foreign molecules and depend, in addition, on the electrical topology of the exposed solid organic layers comprising the junction. The adsorption, therefore, may be regarded as a type of contour fitting to the structural and electronic pattern of the organic surfaces. This produces an alteration in electron orbital distribution in the solid, which results in a change in rectification characteristic unique to each kind of foreign molecule adsorbed.

A second reason that inorganic P–N junction devices cannot be employed as general molecular detectors derives from the fact that they are limited to relatively few materials, such as silicon and germanium, having relatively simple crystal structures. Because of this lack of structural variety, a plurality of such devices would not avail in the identification of an adsorbed molecular species, or in the discrimination between several such species. A plurality of organic junction devices, on the other hand, may be variously constituted to include a great richness in structural variety; each device responding in its own particular manner to adsorbed molecular species. The summation of these responses constitutes a finger print, as it were, of the adsorbed molecular species. The magnitude of these responses discloses how many molecules are adsorbed, as determined by the ambient concentration. Thus, a plurality or organic junction devices according to this invention yields in electronic form, information disclosing both the identity and concentration of ambient molecular species.

The human nose is considered to have seven different types of olfactory receptors, from which it is capable of deriving an enormous variety of conclusions concerning the presence of foreign molecules in air. It is feasible to employ this number of differently constituted organic junction devices, or any excess thereof deemed necessary for a particular discriminatory application, as an olfactory array. Such an array is immune to some of the drawbacks often affecting the human nose, such as lapse in vigilance, misinterpretations, and irrational response to certain odors. Furthermore, the sensitivity and discriminatory powers of the olfactory array can be manipulated at will and tailored to specific detection problems.

Objects of this invention are to:

Provide an electrical sensor of molecular matter,

Provide such a sensor employing a junction between dissimilar organic materials, Provide an olfactory sensor, Provide such a sensor having plural exposures of a junction between dissimilar organic materials, Provide such a sensor having plural junctions between different pairs of organic materials to allow selective identification of olfactory agents, and Employ a diode characteristic variation upon exposure to certain molecules to provide the sensor mechanism.

Other objects will be apparent upon reading the following detailed specification and upon examining the accompanying drawings, in which are set forth by way of illustration and example certain embodiments of the invention.

Figure 4:
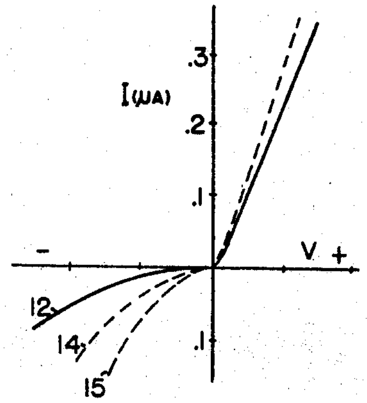
Figure 2:
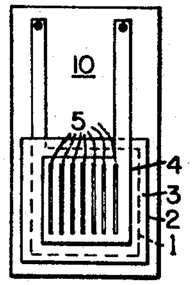
Figure 3:
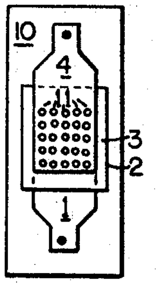
Figure 5:
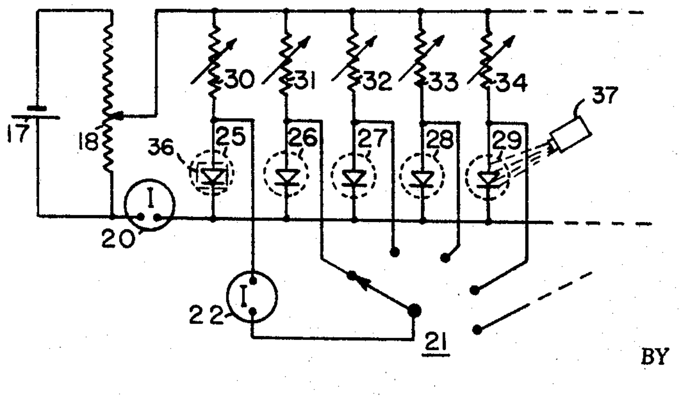

FIG. 1 shows a sectional elevation view of a typical embodiment of one organic junction device, with a schematic diagram of an electrical circuit for the same, FIG. 2 shows a representative plan view of the same, having plural incisions therein, FIG. 3 shows a representative plan view of the same according to an alternate embodiment having plural apertures therein, FIG. 4 shows a typical diode characteristic of an organic junction, and typical changes in the characteristic caused by exposure of the junction to certain foreign molecules, and FIG. 5 shows an example of an electrical circuit for selective qualitative and quantitative identification of molecular substances.

In FIGS. 1–3 the olfactory sensor diode consists of a metallic layer 1 in contact with an organic conductive layer 2, a second organic conductive layer 3, different from the first layer and overlying it, and a second metallic layer 4 surmounting the stack. One of the metallic layers may act as a structural support for the device, as layer 1 in FIG. 1; or the device may be supported on an insulating substrate 10, such as glass, mica or plastic, as shown in FIGS. 2 and 3. In FIGS. 1 and 2 incisions 5 are made through the organic layers and one of the metallic layers to permit maximum exposure of the organic layers to ambient molecules. In FIG. 3 plural apertures 11 serve the same purpose.

FIG. 1 also shows a typical electrical circuit by means of which the response of the olfactory sensor diode may be measured. A potential is applied to the outer metallic layers 1 and 4 from power supply 6 of direct current, which is adjusted in voltage by potentiometer 7 and is monitored by voltmeter 8. The potential is applied to the device in the reverse bias mode to achieve maximum sensitivity; that is, to provide operation at the left of the vertical axis in FIG. 4. Current flowing through the device is measured by means of series-connected electrometer 9, or by an equivalent instrument capable of providing indications in the fraction of a microampere range, typically.

Although FIGS. 1–3 illustrate a planar embodiment of this invention it will be understood that other shapes are likewise possible. For example, one of the electrodes may be a cylindrical metal wire coated with layers corresponding to layers 2, 3 and 4 of FIGS. 1–3. In another example the layers are formed on the inside of a tube and the gas or liquid to be analyzed is passed through the tube. In any of these embodiments monocrystallinity of either of the organic layers or the metallic layers is not required for the successful functioning of the device.

The layers are readily formed by vacuum deposition. In typical embodiments of this invention the metal electrodes were evaporated from crucibles that were heated by electrical resistance means, or directly from tungsten resistance elements, onto the substrate. The entire operation was conducted in a commercial vacuum coating unit at pressures of $10^{-5}$ to $10^{-6}$ torrs. The organic layers were typically evaporated from small electrical resistance heated Pyrex test tubes, plugged lightly with glass wool to filter out particles of solid that might be expelled from the heated mass. Starting vacua were around $10^{-5}$ torrs and approached $10^{-4}$ torrs as evaporations were completed. The distances between source and substrate were typically 10 to 20 cm. In both types of operations the heating currents for the sources were regulated by externally situated variable transformers.

However, other means of producing the layers, such as sublimation, evaporation from solution, electrodeposition, electrostatic deposition, powder compaction, and the like, will also be efficacious in various applications. With vacuum deposition techniques, useful layer thicknesses generally lie between 0.1 micron and 10 microns. Compressed powder methods normally require thicker layers but, by including metal powders for the metallic layers, offer the advantage of forming a complete device in a single compression operation.

In a typical embodiment for the compressed powder method, a thin layer of copper powder was placed in the bottom of a cylindrical steel die, followed by the two selected organic materials in powder form, and by a final layer of copper powder. The charge was tamped lightly after the addition of each layer, to insure uniform distribution and contact among the separate layers of solid. The compression tool was then inserted into the die and the assembly compressed at pressures of 30,000 to 70,000 pounds per square inch. The resulting disk was then expelled from the die and the edges were trimmed with a light abrasive or cutting tool to remove any displaced edge material. Electrical leads were attached to the copper layers, using conductive silver paint.

The multiple incisions 5 for exposing the junction layers may be made by scribing, electrical discharges, thermal discharges, particle impingement, or other mechanical or chemical means. In one embodiment, scratches were introduced by gently drawing a razor or pen knife through the layers. In another embodiment, thin strips of pressure sensitive adhesive tape were applied to the top metal electrode. Upon lifting the tape the adhering metal was also removed, exposing the organic layers beneath it. More complete exposure of the junction was accomplished by a second application of tape, or by gentle scribing or solvent erosion, at the areas previously made bare of metal. Alternatively, the strips of tape may be applied to the initial substrate prior to deposition of the layers. After deposition the tape is grasped with tweezers and lifted off. The edges of the tape produce edgewise exposure of the adjacent layers. Fine wires or threads can be similarly employed.

In certain of these operations recourse may be had to photographic masking techniques, such as photoresist and photoetching, for accurately defining exposure areas.

A typical current-voltage characteristic of an organic olfactory sensor with respect to its diode characteristic, as constructed above, is shown by the solid curve 12 in FIG. 4. This curve was obtained by using the circuit shown in FIG. 1. In this circuit power supply 6 may be a battery as indicated, with a voltage of the order of 5 volts, while potentiometer (voltage-divider) 7 has a total resistance of 10,000 ohms. A voltage of 1½ volts for the reverse bias is preferred for the usual organic materials employed herein, since some such devices have a knee in the reverse bias characteristic at approximately 2 volts. The desired operating voltage can easily be obtained in practice by calibrating potentiometer 7. The sensors typically have resistances in the multimegohm range.

In the subject embodiment the metallic layers were made of lead and were connected to the external circuit by means of silver paint. The organic junction consisted of a layer of fluorescein and a layer of indigo in one example, and of a layer of fluorescein and a layer of phenazine in another example. The first example is of the P and P+ type, fluorescein behaving more strongly P-type than indigo, while the second example is of the P and N type, with phenazine acting as the N-type material. Incisions in these junctions were made by the scribing process.

When devices of this type were exposed to air containing various contaminants, such as moisture, sulfur dioxide, or certain amines, the reverse characteristic changed significantly. An example of this is shown by dotted curve 14 of FIG. 4, when the device was exposed to sulfur dioxide in the part-per-million range of concentration in air. When the device was flushed with pure air, the reverse characteristic returned to that represented by the solid curve. When the concentration of sulfur dioxide was increased to a higher value the reverse current increased correspondingly, as typified by dotted curve 15 in FIG. 4.

Alternatively, when the concentration of sulfur dioxide was held constant but the number of incisions in the device was increased, thus exposing more junction area to the gas, the response again increased as typified by dotted curve 15. Responses to the same gas also varied between differently constituted devices.

These tests showed that exposure of the junction is essential to the functioning of the device as a molecular sensor, that the response of the sensor to certain contaminant molecules is reversible and concentration-dependent, and that differently constituted sensors may be employed in identifying a contaminant by measuring their differences in responses. It will be recognized that this group of properties represents a highly important inventive advance.

One arrangement for using several differently constituted molecular sensors in a single array is illustrated in FIG. 5; where elements 25, 26, 27, 28, 29, etc., represent a plurality of sensor diodes connected in parallel to a voltage source 17, regulated by voltage divider 18. Each sensor is also regulated individually by a variable resistor, 30, 31, 32, 33, 34, etc., in order to adjust the response to an optimum reference current for a given standard ambient, such as air, and to use the rectification characteristic of each sensor in its most favorable region for a particular detection application. Source 17 may have a voltage of the order of 5 volts. It need supply only currents in the microampere range in addition to the current taken by voltage divider 18, which may have a resistance of 10,000 ohms. Each of resistors 30–34 should have a resistance approximately equal to the sensor to which it connects; i.e., 100 megohms.

On exposure to a contaminated ambient, the increase in current through the entire array is read on a current measuring device, such as microammeter 20. This indicates the concentration of contaminant present. The identification of the contaminant is achieved by comparing the responses of each individual sensor and obtaining a differential response unique to the molecular structure of the contaminant. In the present illustration this is done by selecting one sensor, 25, as a reference diode and measuring current flow between it and each of the other diodes individually; utilizing switch 21 and microammeter, or electrometer, 22.

Adjustable reisstor 30 is connected in series with sensor 25, adjustable resistor 31 is connected in series with sensor 26, etc., in a pair across the main voltage supply from voltage divider 18. From the common connection between resistor 30 and sensor 25 one terminal of microammeter 22 is connected and from the second terminal thereof a connection is made to the switch arm of switch 21. The latter is preferably a one-pole multiposition switch and each of the position contacts connects to a common connection between another resistor, such as 31, and another sensor, such as 26.

In operation, the current gain in sensor 26 may be five times as much as that in sensor 25 in the presence of ammonia, but only half as much in the presence of sulfur dioxide.

Alternate embodiments to that shown in FIG. 5 for obtaining molecular concentration and identification information from a array of sensors are possible. For example, the use of bridge-type circuits with bucking potentials tends to give increased linearity of response. Individual potentiometers substituted for each of resistors 30–34 permits more accurate presetting of sensor reference currents. Regardless of the circuit details, the essential functions of the circuit are to integrate the electrical response for concentration measurement and to differentiate the same, one from the other, for molecular identification. To accomplish these functions the sensor array is calibrated against known concentrations of the contaminants of interest diluted in a standard ambient gas or liquid phase by noting the readings of meters 20 and 22 for each condition. It is unnecessary to have prior knowledge of the molecular structure of a contaminant, or mixture of contaminants, provided sufficient reference samples are available for calibration purposes.

In more advanced arrangements, an array of molecular sensors may be coupled, through analog to digital conversion, to pattern recognition logic operations capable of providing a prompt display of compositions encountered by the array. In digital form such composition displays can be stored in a memory for future reference, or for triggering an alarm, without resorting to a detailed analysis of the molecular species present in the original composition.

The molecular identification function thus far specified depends upon the comparative use of two or more differently constituted sensors. However, other differentiating modes of operation are possible for accomplishing identification. For example, two similarly constituted sensors will respond differently to adsorbed molecules if one of the sensors is held at a higher temperature than the other. This results from the fact that conductivities in the two organic layers of each device respond differently to temperature, and from the fact that the temperature dependence of adsorption is different for different molecules. A somewhat analogous difference in response between two similarly constituted sensors arises when one of them is illuminated and the other is kept in the dark. A more sophisticated embodiment is to illuminate with monochromatic light at a wavelength selected for maximum response of the sensor to a particular molecular entity. In view of these alternate embodiments it follows that differentiation techniques employing differently constituted sensors, as originally described, should be held with the sensors at constant temperature and in the absence of illumination, or of changes in the illumination level.

Another mode of accomplishing the identification function involves introducing an additional carrier gas, which modifies the interaction of contaminants with the sensor in a characteristic manner. This effect may depend upon competitive adsorption between the contaminants and the additive. Alternatively, the composition of the additive may be adjusted to that suspected of the contaminant until matching responses are observed. Further, the response of a sensor may be modified by bathing it in a fluid that tends to selectively dissolve certain contaminants from the ambient atmosphere, or influence their interactions with the junction surfaces, thus giving a response that would not occur in the presence of the gas phase alone. Solid semipermeable films or barriers may be used in a like manner, but tend to slow down the response of the sensor to changes in ambient composition. The use of such barriers, whether solid or liquid, provides one means of protecting the sensor from deposits of particulate matter, or from highly reactive chemicals which may have a deleterious effect on its function. It will be understood that for the liquid barrier, any of the sensors of FIGS. 1–3 are merely immersed in the liquid, while for the solid barrier the same may be coated over the whole sensor or only at the junction exposures, at 5, 11, etc., as shown at 36.

The ultimate sensitivity of a detector array can be enhanced in various ways. One is by solution concentration in selected liquids bathing the sensor, as mentioned above. Another is to concentrate the sample from larger volumes of gas by physical means, such as freezing or gas chromatography. Conversely, the use of embodiments of this invention as detectors in gas chromatography is possible.

The use of physical concentration methods for enhancing detection sensitivity must take into account possible molecular rearrangements, or other artifacts, introduced by the concentration method that could lead to erroneous identifications of original contaminants.

In addition to the N and P materials previously stated as suitable for junctions there may be added; phenazine and chloranil/2,5-dimethoxyaniline complex, and phenazine and dichlorodicyanobenzoquinone/p-phenylenediamine complex. The first-mentioned material is the N or donor semiconductor and the second-mentioned material is the P or acceptor semiconductor.

In the embodiments where different temperature or different illumination may be employed to alter the sensitivity to molecular adsorption it will be recognized that such differences may be brought about by impressing a different degree of radiant energy of appropriate wavelength upon the organic junction, as by source 37.

Although the invention has been described in preferred forms with particularity, such disclosure has been made only by way of example, and various changes in the details of construction and the combination of materials and parts may be made without departing from its spirit and scope.

Having thus fully described the invention and the manner in which it is to be practiced, I claim:

1. An electronic olfactory sensor device comprising;

(a) a first electronically conductive conjugated organic compound (2) of the group including fluorescein, indigo, phenazine, chloranil and charge transfer complexes thereof having electron donors and acceptors;

(b) a second differently constituted organic compound (3) of the group including fluorescein, indigo, phenazine, chloranil and other predominantly conjugated organic compounds and charge transfer complexes thereof, also having electron donors and acceptors, and having electronic conductive properties differing from those of said first organic compound;

(c) said first and second organic compounds disposed in contact, one with the other, to form an electronically asymmetric rectifying junction boundary across which electronic conduction may be effected;

(d) aperture means (5 or 11) to render said boundary multiply permeable, to expose said boundary to molecules of an olfactory agent to be sensed;

(e) first (1) and second (4) means to establish electrical connection to said first and second organic compounds, respectively;

(f) voltage means (6, 7) connected to said first and second means, and (g) further means (9), also connected to said first and second means, to indicate the alteration of the electronic characteristic of said boundary by adsorption of said molecules of olfactory agent to be sensed.

2. The sensor device of claim 1, in which;

(a) said first organic compound is phenazine, and (b) said second organic compound is selected from the group including fluorescein, indigo, chloranil/p-phenylenediamine charge transfer complex, chloranil/2,5-dimethoxyaniline charge transfer complex, and tetracyanoquinodimethane/triethylamine charge transfer complex.

3. The sensor device of claim 1, in which;

(a) said first organic compound is indigo, and (b) said second organic compound is selected from the group including fluorescein, chloranil, chloranil/p-phenylenediamine charge transfer complex, chloranil/2,5-dimethoxyaniline charge transfer complex, and tetracyanoquinodimethane/triethylamine charge transfer complex.

4. The electronic olfactory sensor device of claim 1, which includes;

(a) plural said sensors (25–29), each having differing pairs of organic compounds, (b) means to impress a potential (17, 18) upon each said sensor to cause it to function as a reverse-biased rectifying junction boundary while exposed to molecules of an olfactory agent, (c) electrical means (20) connected to said sensors in parallel array to measure the integrated electronic response according to the concentration of olfactory agent incident upon said plural sensors, and (d) second electrical (22) and switching (21) means to selectively connect and measure the singular electronic response of each said sensor as uniquely acted upon by the molecular composition of said olfactory agent incident upon each said sensor.

5. The electronic olfactory sensor device of claim 4, which additionally includes;

(a) means to impress a different degree of radiant energy upon selected said plural sensors.

6. The electronic olfactory sensor device of claim 4, which additionally includes;

(a) semipermeable film means interposed between selected said sensors and a source of said olfactory agent to admit certain molecular components of said olfactory agent to the said sensors while excluding others.

References Cited

UNITED STATES PATENTS

| | | | |
|---|---|---|---|
| 2,007,324 | 7/1935 | Budgett | 73—23 |
| 2,047,638 | 7/1936 | Kott | 324—62 XR |
| 2,504,965 | 4/1950 | Davis | 324—65 XR |
| 2,711,511 | 6/1955 | Pietenpol | 324—71 |
| 3,249,830 | 5/1966 | Adany | 317—234 |

RUDOLPH, V. ROLINEC, *Primary Examiner.*

E. E. KUBASIEWICZ, *Assistant Examiner.*

U.S. Cl. X.R.

73—28; 252—500, 623; 317—234; 324—65; 338—34